US010698448B2

(12) United States Patent
Watanabe (10) Patent No.: US 10,698,448 B2
(45) Date of Patent: Jun. 30, 2020

(54) ELASTIC SUPPORT SUBSTRATE FOR FLEXIBLE DISPLAY, FLEXIBLE DISPLAY, AND FLEXIBLE DISPLAY LAYERED BODY (71) Applicant: Sharp Kabushiki Kaisha, Sakai, Osaka (JP)

(72) Inventor: Noriko Watanabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/473,260

(22) PCT Filed: Sep. 29, 2017

(86) PCT No.: PCT/JP2017/035464
§ 371 (c)(1),
(2) Date: Jun. 25, 2019

(87) PCT Pub. No.: WO2019/064488
PCT Pub. Date: Apr. 4, 2019

(65) Prior Publication Data
US 2020/0150724 A1  May 14, 2020

(51) Int. Cl.
| | |
|---|---|
| *H05K 1/02* | (2006.01) |
| *H01L 27/32* | (2006.01) |
| *H01L 51/00* | (2006.01) |
| *H01L 51/52* | (2006.01) |
| *G06F 1/16* | (2006.01) |
| *G06F 3/041* | (2006.01) |
| *G06F 3/042* | (2006.01) |
| *G06F 3/0486* | (2013.01) |
| *G06F 3/0488* | (2013.01) |

(Continued)

(52) U.S. Cl.
CPC ............ *G06F 1/1652* (2013.01); *G09F 9/301* (2013.01); *H01L 51/0097* (2013.01)

(58) Field of Classification Search
CPC ........... H05K 1/02; H01L 27/32; H01L 51/00; H01L 51/52; G06F 1/16; G06F 3/041; G06F 3/044; G06F 3/0486; G06F 3/0488; G09F 15/00
USPC ................. 361/679.02, 749; 40/610; 257/40; 438/27; 1/1
See application file for complete search history.

(56) References Cited

U.S. PATENT DOCUMENTS 10,013,084 B2 *  7/2018  Kang ...................... G06F 3/044
2004/0192082 A1  9/2004  Wagner et al.
(Continued)

FOREIGN PATENT DOCUMENTS

| | | |
|---|---|---|
| GB | 2 205 431 B | 12/1988 |
| GB | 2521616 A | 7/2015 |

(Continued)

OTHER PUBLICATIONS

Official Communication issued in International Patent Application No. PCT/JP2017/035464, dated Jan. 9, 2018.

*Primary Examiner* — Xiaoliang Cheng
(74) *Attorney, Agent, or Firm* — Keating & Bennett, LLP (57) ABSTRACT An elastic support substrate elastically deforms in at least a longitudinal direction that is a winding direction, and as for the longitudinal direction and the lateral direction that is a direction orthogonal to the longitudinal direction, the elastic support substrate is less likely to deform in the longitudinal direction.

19 Claims, 8 Drawing Sheets (51) Int. Cl.
*G09F 15/00* (2006.01)
*G09F 9/30* (2006.01)

(56) References Cited

U.S. PATENT DOCUMENTS

| | | | | |
|---|---|---|---|---|
| 2008/0086925 A1* | 4/2008 | Yang | ................. | G09F 9/301 |
| | | | | 40/610 |
| 2015/0092362 A1* | 4/2015 | Ahn | ................. | G02F 1/133305 |
| | | | | 361/749 |
| 2015/0325804 A1 | 11/2015 | Lindblad | | |
| 2016/0079329 A1* | 3/2016 | Lee | ................. | H01L 27/3244 |
| | | | | 257/40 |
| 2016/0255713 A1* | 9/2016 | Kim | ................. | G02F 1/133305 |
| | | | | 361/749 |
| 2017/0003440 A1 | 1/2017 | Kim et al. | | |
| 2017/0141168 A1* | 5/2017 | Choi | ................. | H01L 27/32 |
| 2017/0156219 A1 | 6/2017 | Heo et al. | | |
| 2018/0284964 A1* | 10/2018 | Kang | ................. | G09F 9/301 |
| 2018/0321708 A1* | 11/2018 | Wu | ................. | G06F 1/1643 |

FOREIGN PATENT DOCUMENTS

| | | |
|---|---|---|
| JP | 63-82499 A | 4/1988 |
| JP | 2006-294536 A | 10/2006 |
| JP | 2012-113275 A | 6/2012 |
| JP | 2013-143346 A | 7/2013 |
| JP | 2015-228022 A | 12/2015 |
| JP | 2017-504197 A | 2/2017 |
| WO | 2014/103802 A | 7/2014 |

* cited by examiner

ELASTIC SUPPORT SUBSTRATE FOR FLEXIBLE DISPLAY, FLEXIBLE DISPLAY, AND FLEXIBLE DISPLAY LAYERED BODY

TECHNICAL FIELD

The disclosure relates to an elastic support substrate for a flexible display, a flexible display, and a flexible display layered body.

BACKGROUND ART

When a thick flexible display is wound around a winding core, its rigidity is increased, which makes it difficult for the flexible display to be wound. In contrast, in some cases, a thin flexible display might be broken due to tension when the thin flexible display is wound.

CITATION LIST

Patent Literature

PTL 1: JP 2006-294536 A (published on Oct. 26, 2006)
PTL 2: JP 2013-143346 A (published on Jul. 22, 2013)
PTL 3: WO 2014/103802 A1 (published on Jul. 3, 2014)

SUMMARY

Technical Problem

An object of the disclosure is to provide a flexible display that can be wound and is unlikely to be broken, and an elastic support substrate, used for it, for the flexible display.

Solution to Problem

An elastic support substrate according to one aspect of the disclosure is used for a windable flexible display, and the elastic support substrate elastically deforms in at least a longitudinal direction being a winding direction and is harder to deform in a lateral direction being a direction orthogonal to the longitudinal direction than in the longitudinal direction.

Advantageous Effects of Disclosure

According to an aspect of the disclosure, a flexible display that can be wound and is unlikely to be broken can be provided.

DESCRIPTION OF EMBODIMENTS

Before the description of an elastic support substrate 40, a flexible display 2 in which the elastic support substrate 40 is used will be described. This facilitates the understanding of the elastic support substrate 40.

Description below relates to an EL display 2 as one example of the flexible display 2. The elastic support substrate 40 of the present embodiment can be used as a support material 10 described below. Alternatively, as another configuration, the elastic support substrate 40 can be provided on the back face of the support material 10.

Display

Figure 1:
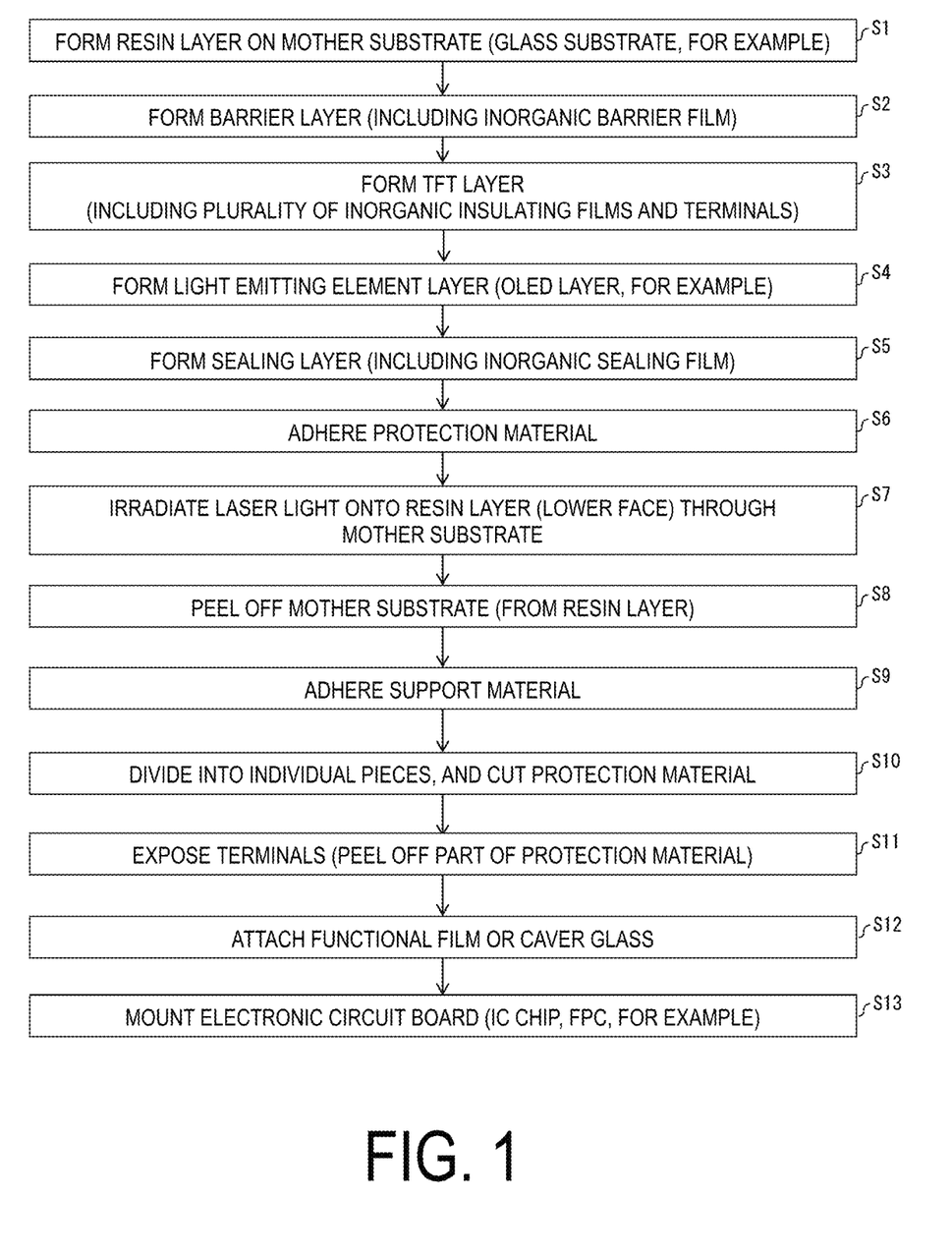
FIG. 1 is a flowchart illustrating one example of a manufacturing method of an electroluminescence (EL) display.
Figure 2A:
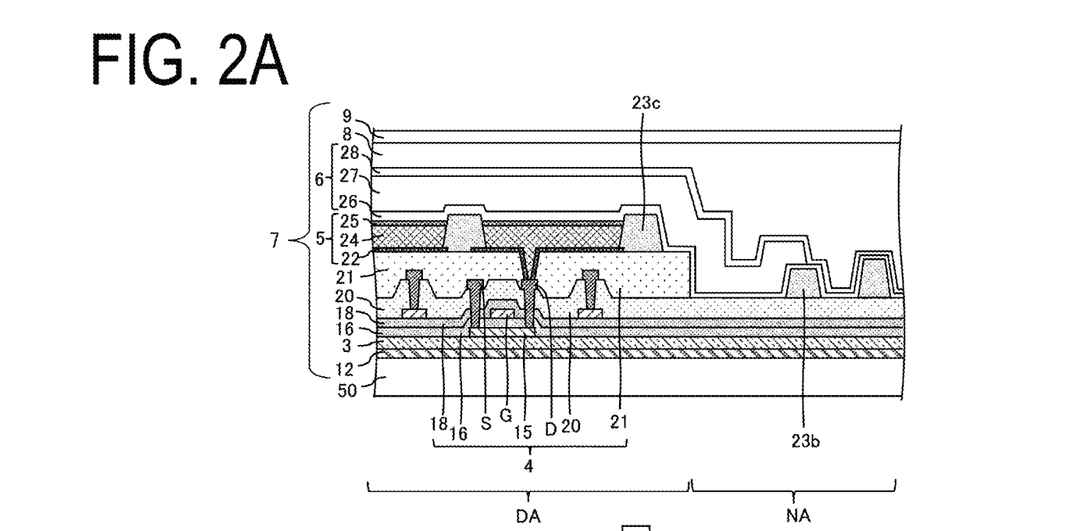
FIG. 2A is a cross-sectional view illustrating an example of the configuration of the EL display during formation.
Figure 2B:
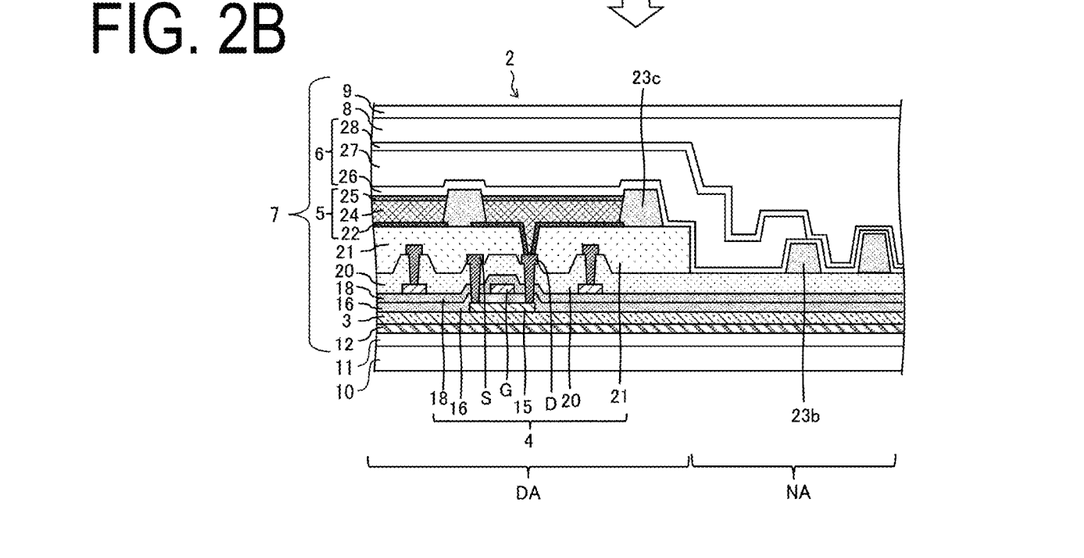
FIG. 2B is a cross-sectional view illustrating an example of the configuration of the EL display.

FIG. 1 is a flowchart illustrating one example of a manufacturing method of the EL display 2 as one example of the flexible display 2. FIG. 2A is a cross-sectional view illustrating an example of the configuration of the EL display 2 during formation. FIG. 2B is a cross-sectional view illustrating an example of the configuration of the EL display 2.

When the flexible EL display 2 is manufactured, as illustrated in FIGS. 1 and 2, substantially, the following Steps S1 to S13 will be performed.

Step S1: A resin layer 12 is formed on a transparent mother substrate 50 such as a glass substrate.

Step S2: An inorganic barrier film 3 is formed.

Step S3: A thin film transistor (TFT) layer 4 including a plurality of inorganic insulating films 16, 18, and 20 and a flattering film 21 is formed.

Step S4: A light-emitting element layer 5 such as an OLED element layer is formed.

Step S5: A sealing layer 6 including inorganic sealing films 26 and 28 and an organic sealing film 27 is formed.

Step S6: A protection material 9 such as a PET film is attached on the sealing layer 6 via an adhesive layer 8.

Step S7: Laser light is irradiated to the resin layer 12. Herein, the resin layer 12 absorbs the laser light that has been irradiated, and thus the lower face of the resin layer 12 which is an interface with the mother substrate 50 changes quality due to ablation. This forms a peeling layer, which reduces bonding force between the resin layer 12 and the mother substrate 50.

Step S8: The mother substrate 50 is peeled from the resin layer 12. This causes the layered body 7 to be peeled from the mother substrate 50. Herein, the layered body 7 indicates the entire multilayer body formed on the mother substrate 50, and, in the example illustrated in FIG. 2A, indicates layers from the resin layer 12 formed on the mother substrate 50 to the protection material 9 which is the uppermost layer.

Step S9: The support material 10 such as the PET film is adhered to the lower face of the resin layer 12 via the adhesive layer 11.

Step S10: The mother substrate 50 is separated, and the protection material 9 is cut, and a plurality of EL displays is cut out.

Step S11: The protection material 9 on a terminal portion of the TFT layer 4 is peeled off, and terminal exposure is performed.

Step S12: A function film (not illustrated) is attached.

Step S13: An electronic circuit board is mounted on the terminal portion using an ACF or the like.

Thereinbefore, the EL display 2 as one example of the flexible display is formed.

Note that in FIGS. 2A and 2B, 4 denotes a TFT layer, 15 denotes a semiconductor film, 16 denotes an inorganic insulating film (gate insulating film), 22 denotes an anode electrode, 23b denotes a bank, 23c denotes a partition, 24 denotes electroluminescence (EL) layer, 25 denotes a cathode electrode, 26 denotes a first inorganic sealing film (inorganic sealing film), 27 denotes an organic sealing film, 28 denotes a second inorganic sealing film (inorganic sealing film), G denotes a gate electrode, S denotes a source electrode, D denotes a drain electrode, DA denotes an active area, and NA denotes a non-active area.

In addition, the active area DA corresponds to an area where the light-emitting element layer 5 is formed (an area where the semiconductor film 15, the gate electrode G, and the drain electrode D are formed) and can be represented as a display area. In contrast, the non-active area NA is an area except for the active area DA and is an area where terminals used for connection with the electronic circuit board and the like are formed.

First Embodiment

Figure 3:
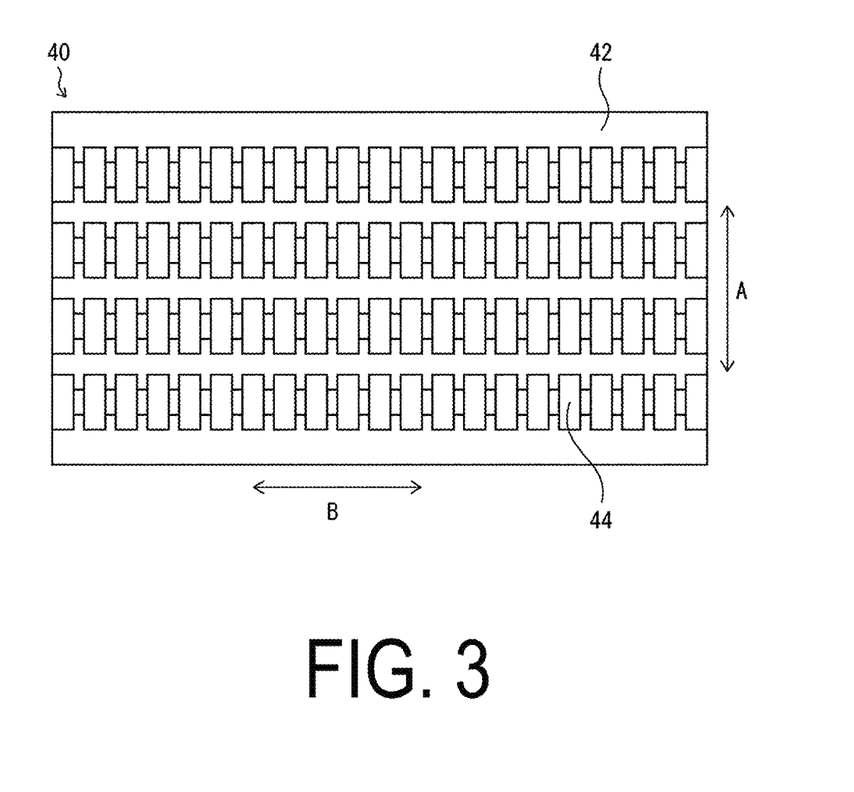
FIG. 3 is a diagram illustrating the outline of an elastic support substrate of a first embodiment.

The elastic support substrate 40 of a first embodiment will be described with reference to FIG. 3. FIG. 3 is a diagram illustrating the outline of the elastic support substrate 40 of the present embodiment. The direction of an arrow A in FIG. 3 indicates a longitudinal direction A (MD direction A) in a case where the flexible display 2 (not illustrated) is long. In contrast, the direction of an arrow B indicates a lateral direction B (TD direction B) of the flexible display 2.

Elastic Support Substrate

The elastic support substrate 40 includes main substrates 42 and coupling materials 44. The main substrate 42 has a strip shape extended in the TD direction B of the flexible display 2. In addition, the length of the extending direction of the main substrate 42 is identical to the length in the TD direction B of the flexible display 2.

A plurality of main substrates 42 is arranged in the MD direction A. Then, the adjacent main substrates 42 are connected with the coupling materials 44. In the present embodiment, the adjacent main substrates 42 are connected by a plurality of coupling materials 44.

Material

Materials forming the main substrate 42 and the coupling material 44 may include one that allows the elastic support substrate 40 to elastically deform in the MD direction A. For example, it is conceivable that the coupling material 44 is formed of a material that elastically deforms in the MD direction A, that is, an elastic body. An example of a material forming the elastic body conceivably includes a high polymer material such as rubber and plastic or a spring material such as a coil spring and a leaf spring. When the spring material is used, the elastic support substrate 40 is unlikely to have curls.

In addition to the coupling material 44, the main substrate 42 may also be formed of an elastic body that elastically deforms in the MD direction A. As the case with the coupling material 44, it is conceivable that the elastic body forming the main substrate 42 includes a high polymer material such as rubber and plastic. That is, the main substrate 42 can be formed of a non-flexible material or can be formed of a flexible material.

Typical Configuration Example

As a typical configuration example, it is conceivable that the main substrate 42 is formed in a strip shape having a thickness of 200 μm, a width (MD direction A) of 20 mm, and a length (TD direction B) of 155 mm (155 mm is the same width of the display, on the assumption that the display is 70 inch), using the non-flexible PRT film as a material.

In contrast, it is conceivable that the coupling material 44 is formed in a strip shape having a thickness of 1 μm, a width (TD direction B) of 20 mm, and a length (MD direction A) of 20 mm.

Then, configuration is conceivable in which the plurality of main substrates 42 is arranged at intervals of 1 mm in the MD direction A, and the contiguous main substrates 42 are coupled with 38 coupling materials 44.

In the aforementioned configuration, the coupling materials 44 are formed of the elastic body, and thus the elastic support substrate 40 expands and contracts in the MD direction A of the flexible display 2 and elastically deforms. The expansion and contraction of the elastic support substrate 40 are caused by the expansion and contraction of the coupling materials 44 while the main substrates 42 do not change their shapes and the contiguous main substrates 40 are held in parallel.

In addition, the main substrate 42 has a strip shape extended in the TD direction B of the flexible display 2. Thus, the elastic support substrate 40 is unlikely to deform in the TD direction B when the MD direction A and the TD direction B are compared.

Layering

The elastic support substrate 40 of the present embodiment can be used as the support material 10 described on the basis of FIG. 2B. Specifically, the elastic support substrate 40 can be provided on the lower face of the resin layer 12 via the adhesive layer 11.

In addition, the elastic support substrate 40 of the present embodiment can also be provided on the lower face of the support material 10, for example, via the adhesive layer. It is configured that a flexible display layered body is formed by externally providing the elastic support substrate 40 on the back face of the support material 10.

Even when the elastic support substrate 40 of the present embodiment is configured to be used as the support material 10 or configured to be provided externally on the lower face of the support material 10, the flexible display 2 that can be wound and is unlikely to be broken can be achieved.

Example of Use

Figure 4:
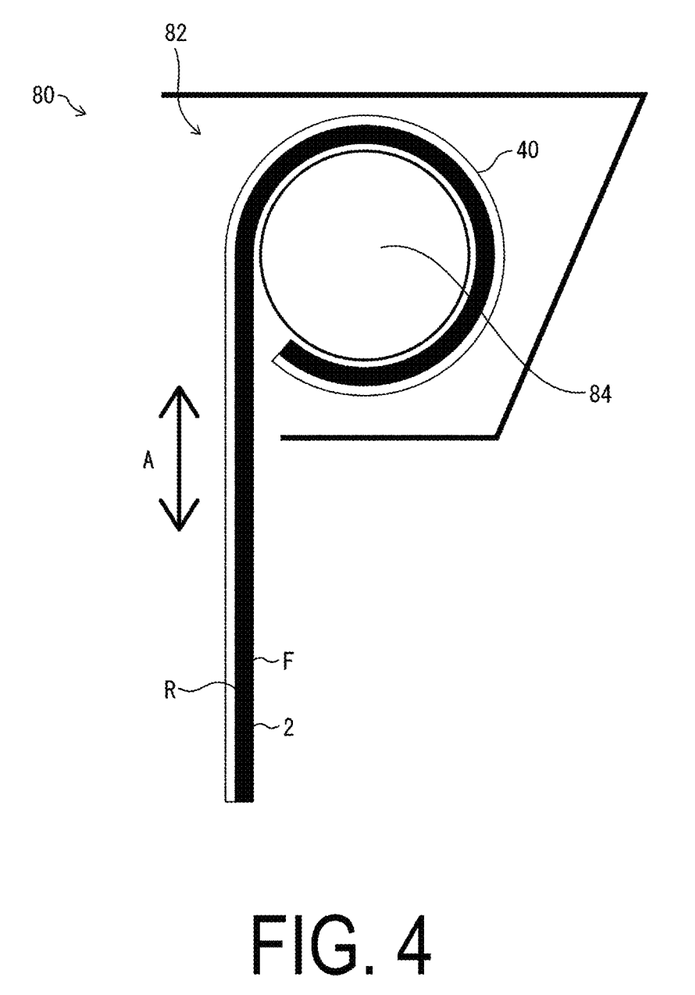
FIG. 4 is a diagram illustrating an example of use of a flexible display according to the first embodiment.

Next, an example of use of the flexible display 2 of the present embodiment will be described with reference to FIG. 4. FIG. 4 is a diagram illustrating an outline in a case where the flexible display 2 is used for a windable screen 80. Specifically, FIG. 4 is a schematic diagram in a case where a winding portion of the windable screen 80 is viewed from above.

The windable screen 80 includes a storage portion 82 at one end thereof and a winding core 84 provided in the interior of the storage portion 82. The winding core 84 serves as a winding core when the flexible display 2 is wound. The flexible display 2 is wound around the winding core 84 and thus stored in the storage portion 82.

The flexible display 2 illustrated in FIG. 4 has a configuration in which the elastic support substrate 40 is provided on the lower face of the support material 10 (not illustrated). In FIG. 4, F indicates the display face of the flexible display 2, and R indicates the back face of the flexible display 2. In the configuration illustrated in FIG. 4, the elastic support substrate 40 is provided on the back face R of the flexible display 2. The flexible display 2 is wound around the winding core 84 while the display face F is inwardly arranged.

When the flexible display 2 is wound in the storage portion 82 or drawn out of the storage portion 82, tension is applied in the MD direction A. The elastic support substrate 40 that can elastically deform in the MD direction A is provided in the flexible display 2 of the first embodiment. Thus, even when tension is applied to the flexible display 2 in the case of being wound or drawn, the destruction of the flexible display 2 can be prevented from occurring.

In addition, the creases or deflection of the flexible display 2 is unlikely to occur in the TD direction B (vertical direction) of the flexible display 2 that is a direction orthogonal to the MD direction A. The main substrates 42 extended in the TD direction B are included in the elastic support substrate 40, which makes it unlikely for the elastic support substrate 40 to deform in the TD direction B, compared with the MD direction A.

Buffer Material

It is assumed that, when the flexible display 2 is wound into the storage portion 82, and the winding core 84 makes one or more revolutions, the elastic support substrate 40 comes into contact with the display face F of the flexible display 2. Thus, a buffer material and the like can be appropriately provided between the elastic support substrate 40 and the display face F in the storage portion 82 in order to prevent the damage on the display face F due to the contact with the elastic support substrate 40.

Modification

Figure 5:
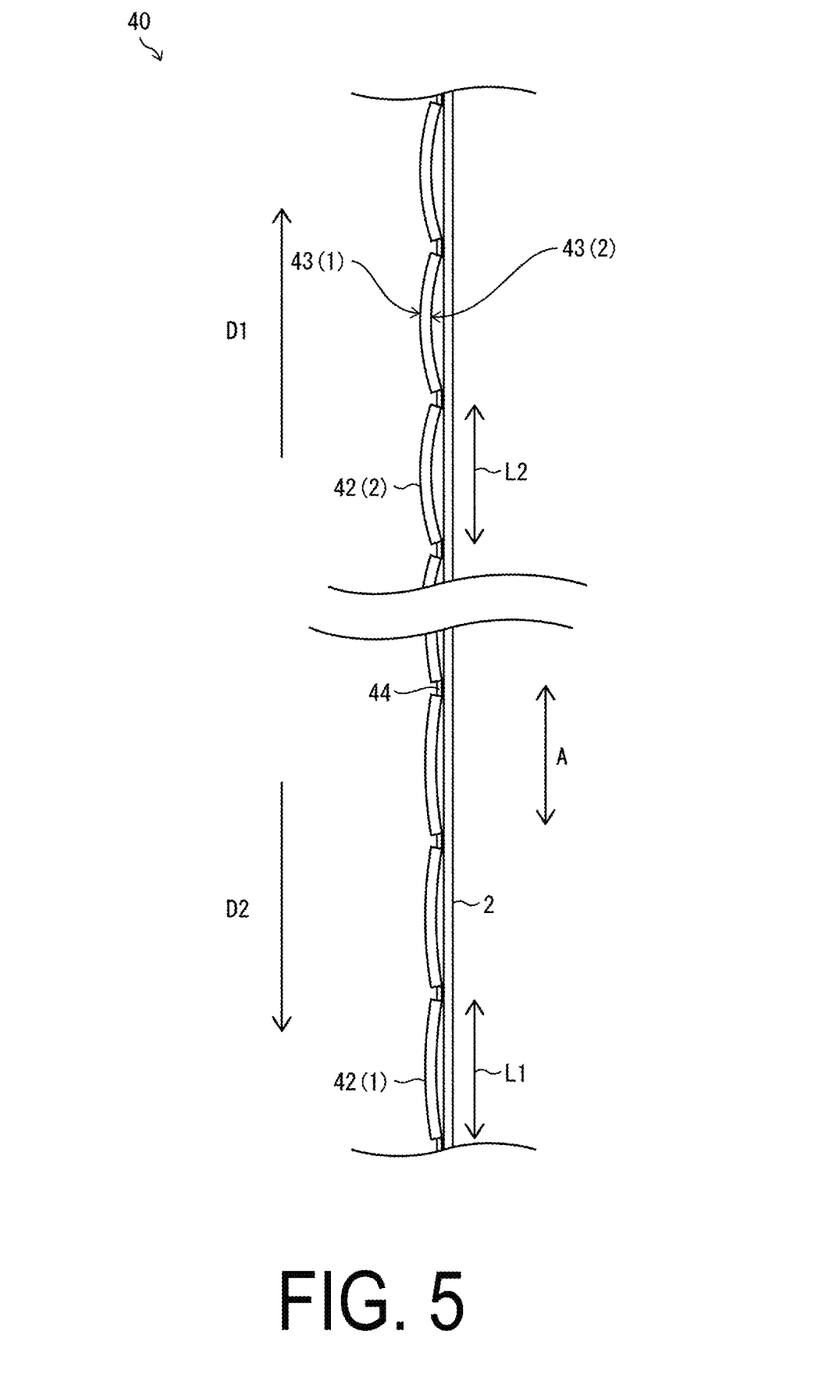
FIG. 5 is a diagram illustrating the outline of a modified example of the elastic support substrate of the first embodiment.
Figure 6:
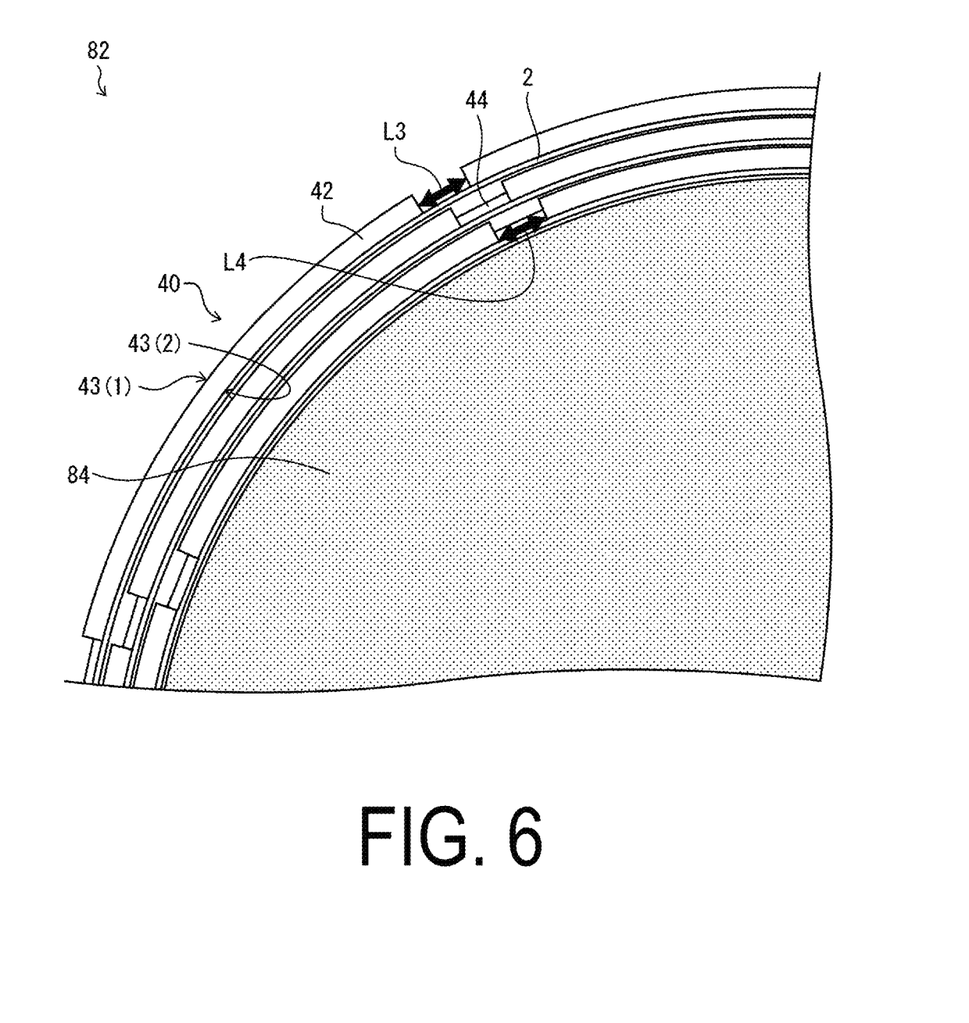
FIG. 6 is a diagram illustrating the outline of a modified example of the elastic support substrate of the first embodiment.

The modification of the elastic support substrate 40 will be described with reference to FIGS. 5 and 6. Both FIGS. 5 and 6 are diagrams illustrating the outline of a modification of the elastic support substrate 40. FIG. 5 represents the flexible display 2 that is not wound in the storage portion 82, and FIG. 6 represents the flexible display 2 that has been wound in the storage portion 82.

The elastic support substrate 40 illustrated in FIG. 3 is different from the elastic support substrate 40 illustrated in FIGS. 5 and 6 in terms of the shape of the main substrate 42. The main substrate 42 illustrated in FIG. 3 has a flat-plate shape. In contrast, the main substrate 42 of the modification has an arc shape, and the circular arc thereof includes an arc in the MD direction A of the flexible display 2. The external side of the arc shape is an arc protrusion area 43(1), and an arc recess area 43(2) is formed on the internal side. Note that the main substrate 42 is formed of a non-flexible material.

The arc direction is a direction in which the arc shape of the main substrate 42 is along the external circumferential shape of the winding core 84 in the case where the flexible display 2 is wound around the winding core 84. That is, the main substrate 42 has an arc shape in the direction in which the flexible display 2 is wound, which allows the main substrates 42 to be along the external circumference of the winding core 84 when the flexible display 2 is wound. Then, in a state where the flexible display 2 is wound around the winding core 84, the flexible display 2 is in a state of being stored on the arc recess areas 43(2) of the main substrates 42.

Radius of Curvature

The radius of curvature of the arc shape of the main substrate 42 corresponds to the radius of curvature of the winding core 84. This is aimed at allowing the main substrates 42 to be along the external circumference of the winding core 84 when the flexible display 2 is wound.

As for the plurality of main substrates 42 provided in the elastic support substrate 40, it is possible to keep constant the radii of curvature thereof or it is possible to vary the radii of curvature thereof. In the case where the radii of curvature are varied, conceivably, when the flexible display 2 is wound around the winding core 84, the main substrates 42 are more easily positioned along the winding core 84.

Specifically, as illustrated in FIG. 5, it is conceivable that the radii of curvature are reduced as the main substrates 42 advance in a direction D1 of approaching the winding core 84, and the radii of curvature are increased as the main substrates 42 advance in a direction D2 of moving away from the winding core 84. Thus, when the radii of curvature of a main substrate 42(1) and a main substrate 42(2) illustrated in FIG. 5 are compared, the radius of curvature of the main substrates 42(1) is great.

Consequently, as the main substrates 42 move away from the storage portion 82, the radii of curvature are increased, and as the number of laps is increased, the radii of curvature of the main substrates 42 are increased, so that the arc shape of the main substrates 42 is easily fitted to the outermost circumference of the flexible display 2.

Other Matters

Note that the widths of the main substrates 42, that is, the lengths in the MD direction A are constant. Thus, when the apparent lengths (L1 and L2, respectively) of the main substrate 42(1) and the main substrate 42(2) illustrated in FIG. 5 in the MD direction A are compared, the apparent length L1 of the main substrate 42(1) in the MD direction A is great because its radius of curvature is great.

In addition, the lengths of the coupling materials 44 are also constant. Thus, as illustrated in FIG. 6, in a state of being wound around the winding core 84, intervals between the contiguous coupling materials 44 are constant irrespective of the number of laps. That is, in FIGS. 6, L3 and L4 that are intervals of the contiguous coupling materials 44 have identical values.

Another Modification

Figure 7:
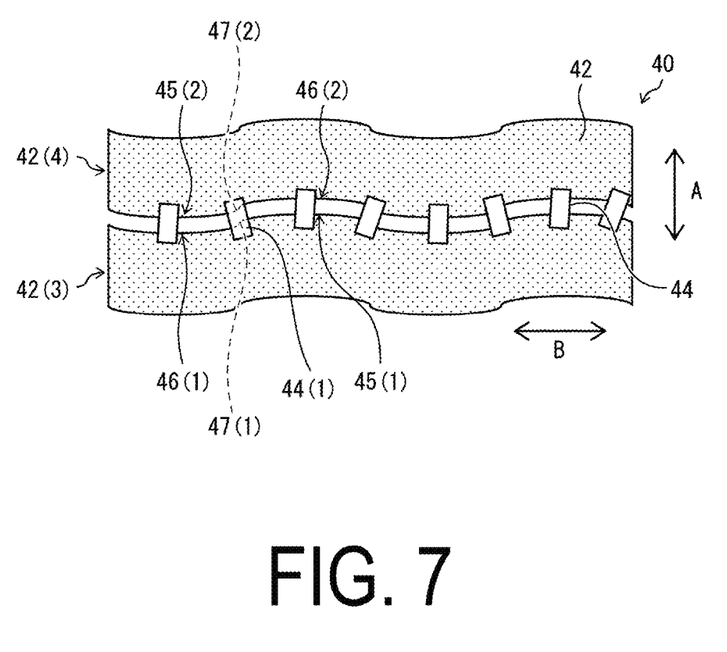
FIG. 7 is a diagram illustrating the outline of a modified example of the elastic support substrate of the first embodiment.

Next, another modification of the elastic support substrate 40 will be described with reference to FIG. 7. FIG. 7 is a diagram illustrating the outline of another modification of the elastic support substrate 40 of the present embodiment.

In FIG. 7, a pair of contiguous main substrates 42 and a coupling material 44 coupling them are extracted from the elastic support substrate 40.

The main substrate 42 illustrated in FIG. 7 and the main substrate 42 previously illustrated in FIG. 3 are different in terms of the shape of the main substrate 42. The main substrate 42 of another modification illustrated in FIG. 7 has a strip shape having a curved shape whereas the main substrate 42 illustrated in FIG. 3 has a strip shape having a rectangular shape.

A first main substrate 42(3) and a second main substrate 42(4) that are contiguous main substrates 42 will be exemplified and described. As illustrated in FIG. 7, the first main substrate 42(3) and the second main substrate 42(4) have a strip shape extended substantially in the TD direction B. Additionally, as for the first main substrate 42(3) and the second main substrate 42(4), the long side (side in the TD direction B) of the strip shape is not linear but curved. Specifically, the first and second main substrates 42(3, 4) have a curved shape having a plurality of protrusions and a plurality of recessions, respectively. More specifically, the first main substrate 42(3) has a curved shape including a protruding and recessed shape exemplified by a curved protrusion portion 45(1) and a curved recess portion 46(1) adjacent to it. In addition, the second main substrate 42(4)

similarly has a curved shape including a curved protrusion portion 45(2) and a curved recess portion 46(2) adjacent to it.

In addition, as for the first main substrate 42(3) and the second main substrate 42(4), the curved shape is formed in such a manner that respective protruding and recessed shapes are opposite to each other. Specifically, the curved protrusion portion 45(1) of the first main substrate 42(3) is opposite to the curved recess portion 46(2) of the second main substrate 42(4). In addition, the curved recess portion 46(1) of the first main substrate 42(3) is opposite to the curved protrusion portion 45(2) of the second main substrate 42(4).

Coupling

As is the case with the elastic support substrate 40 illustrated in FIG. 3, the first main substrate 42(3) and the second main substrate 42(4) are coupled with the coupling materials 44.

Herein, in the elastic support substrate 40 of the present modification, the main substrate 42 has a curved shape. Thus, the coupling materials 44 couple the two contiguous main substrates 42 not in the direction in parallel to the MD direction A (first direction) but in an oblique direction with respect to the MD direction A. A coupling material 44(1) illustrated in FIG. 7 will be exemplified and described.

The coupling material 44(1) couples two contiguous main substrates 42 in the central portion of the undulation of the curved shape. Its coupling points are a first central portion 47(1) in the first main substrate 42(3) and a second central portion 47(2) in the second main substrate 42(4) on the other side. The first central portion 47(1) is a central portion of the curved protrusion portion 45(1) and the curved recess portion 46(1) that are contiguous protrusion and recess portions in the first main substrate 42(3). In addition, the second central portion 47(2) is a central portion of the curved recess portion 46(2) and the curved protrusion portion 45(2) that are contiguous protrusion and recess portions in the second main substrate 42(4). Note that the curved protrusion portion 45(1) and the curved recess portion 46(1) of the first main substrate 42(3) and the curved recess portion 46(2) and the curved protrusion portion 45(2) of the second main substrate 42(4) are protrusion and recess portions opposite to each other, respectively.

The coupling material 44(1) that couples two contiguous main substrates 42 via the first central portion 47(1) and the second central portion 47(2), as illustrated in FIG. 7, is not parallel to the MD direction A. The coupling material 44(1) couples the main substrates 42 in an obliquely inclined direction. This applies an elastic force in the oblique direction, so that even when stress that deforms in the oblique direction with respect to the elastic support substrate 40 is applied, a restoring force against the stress acts.

Note that the main substrates 42 illustrated in FIG. 7, like the main substrates 42(1) and 42(2) previously illustrated in FIGS. 5 and 6, may further have an arc shape and be configured to include an arc recess area 43(2) on the inside of its arc.

Second Embodiment

Figure 8:
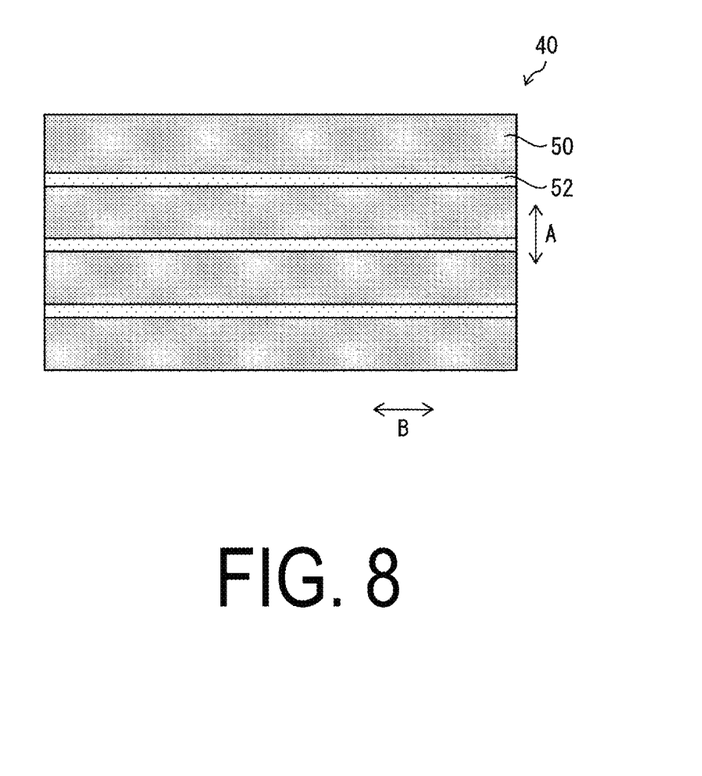
FIG. 8 is a diagram illustrating the outline of the elastic support substrate of a second embodiment.

The elastic support substrate 40 of a second embodiment will be described with reference to FIG. 8. FIG. 8 is a diagram illustrating the outline of the elastic support substrate 40 of the second embodiment.

The elastic support substrate 40 of the second embodiment is different from the elastic support substrate 40 of the first embodiment in that the elastic support substrate 40 of the second embodiment does not include the main substrates 42 and the coupling materials 44 and is formed of a single sheet.

As illustrated in FIG. 8, the elastic support substrate 40 is formed of a single sheet. In the sheet, sections 50 having a large film thickness of a sheet and sections 52 having a small film thickness of a sheet are alternately arranged. The sheet is formed of rubber as a material. Thus, the entire elastic support substrate 40 acts as an elastic body.

The sections 50 having a large film thickness and the sections 52 having a small film thickness both have a strip shape extended in the TD direction B of the flexible display 2. Then, the sections 50 having a large film thickness and the sections 52 having a small film thickness are alternately arranged side by side in the MD direction A of the flexible display 2. In addition, when the length of the sections 50 having a large film thickness in the MD direction A and the length of the sections 52 having a small film thickness in the MD direction A are compared, the length of the sections 50 having a large film thickness is greater than that of the sections 52 having a small film thickness. That is, the width of the strip shape of the sections 50 having a large film thickness is greater than that of the sections 52 having a small film thickness.

In addition, as for the sections 50 having a large film thickness and the sections 52 having a small film thickness, the sections 50 having a large film thickness is less likely to elastically deform due to the large film thickness than the sections 52 having a small film thickness.

In addition, the sections 50 having a large film thickness have a strip shape having a wide width and a large film thickness and thus is less likely to deform in the TD direction B.

As described above, the sections 50 having a large film thickness of a sheet and the sections 52 having a small film thickness of a sheet of the second embodiment similarly act as the main substrates 42 and the coupling materials 44 of the first embodiment, respectively. That is, the sections 52 having a small film thickness easily expands and contracts in the MD direction A, which allows the entire elastic support substrate 40 to easily elastically deform in the MD direction A. In addition, the sections 50 having a large film thickness have high rigidity in the TD direction B and can prevent the creases or deflection of the flexible display 2 in the TD direction B.

Note that, as is the case with the elastic support substrate 40 of the first embodiment, the elastic support substrate 40 of the second embodiment can be provided on the lower face of the resin layer 12 via the adhesive layer 11 as the support material 10. In addition, as another configuration, the elastic support substrate 40 can be provided on the lower face of the support material 10 via the adhesive layer and the like. In any case, the configuration is such that the adhesive layer is provided on sections corresponding to the sections 50 having a large film thickness, and the adhesive layer is not provided on the sections 52 having a small film thickness.

Note that the materials of the elastic support substrate 40 are not limited to rubber, but other materials having elasticity can be used. In addition, it is not necessary to form the entire elastic support substrate 40 using a type of material, and for example, it is possible to vary the materials of the sections 50 having a large film thickness and the sections 52 having a small film thickness.

Typical Configuration Example

As a typical configuration example, it is conceivable that the sections 50 having a large film thickness are formed in a strip shape having a thickness of 8 µm, a width (MD direction A) of 20 mm, and a length (TD direction B) of 155 mm. In contrast, it is conceivable that the sections 52 having a small film thickness are formed in a strip shape having a thickness of 3 μm, a width (TD direction B) of 10 mm, and a length (MD direction A) of 155 mm.

Then, configuration is conceivable in which the sections 50 having a large film thickness and the sections 52 having a small film thickness are alternately arranged in the MD direction A.

However, respective dimensions such as the width or film thickness of the sections 50 having a large film thickness and the sections 52 having a small film thickness can be appropriately optimized.

Flexible Display

Note that the flexible display used in the present embodiment is not particularly limited to a specific display as long as it is a display that has flexibility, and includes bendable light-emitting elements. The light-emitting element is a light-emitting element whose luminance and transmittance are controlled by an electric current, and examples of the electric current-controlled light-emitting element include an organic electro luminescence (EL) display including an Organic Light Emitting Diode (OLED), an EL display such as an inorganic EL display including an inorganic light-emitting diode, or a QLED display including a Quantum Dot Light Emitting Diode (QLED).

Supplement

An elastic support substrate according to a first aspect of the disclosure is used for a windable flexible display, wherein the elastic support substrate elastically deforms in at least a longitudinal direction being a winding direction, and the elastic support substrate is harder to deform in a lateral direction being a direction orthogonal to the longitudinal direction than in the longitudinal direction.

The elastic support substrate according to the second aspect of the disclosure includes a plurality of non-flexible main substrates configured to be formed in a strip shape and extend in the lateral direction, and at least one coupling material configured to couple the main substrates, wherein the plurality of main substrates is arranged in the longitudinal direction, the at least one coupling material includes a plurality of coupling materials, the plurality of coupling materials couples the adjacent main substrates, and the at least one coupling material elastically deforms.

The elastic support substrate according to the third aspect of the disclosure is such that the main substrates have an arc shape, and a radius of curvature of the arc shape corresponds to a radius of curvature of a winding core around which the flexible display is wound.

The elastic support substrate according to the fourth aspect of the disclosure is such that when the flexible display is wound around the winding core, the flexible display is stored in a recess area of the main substrate, the recess area being formed in the arc shape.

The elastic support substrate according to the fifth aspect of the disclosure is such that as the main substrates approach the winding core in the longitudinal direction, the radius of curvature of the arc shape is reduced.

The elastic support substrate according to the sixth aspect of the disclosure is such that the main substrates have a curved shape including a plurality of protrusions and a plurality of recesses, the main substrates include a first main substrate and a second main substrate, the protrusion of the first main substrate and the recess of the second main substrate adjacent to the first main substrate are opposite to each other, a direction in which the main substrates are aligned is a first direction, and the at least one coupling material couples the first main substrate with the second main substrate in parallel to the first direction.

The elastic support substrate according to the seventh aspect of the disclosure is such that in a first central portion being a central portion between the protrusion of the first main substrate and the recess adjacent to the protrusion in the first main substrate, and in a second central portion being a central portion between the recess of the second main substrate, the recess being opposite to the protrusion of the first main substrate, and the protrusion of the second main substrate, the protrusion being opposite to the recess of the first main substrate, the at least one coupling material obliquely couples the first central portion and the second central portion with respect to the first direction.

The elastic support substrate according to the eighth aspect of the disclosure is such that the at least one coupling material is at least one of rubber, a coil spring, and a leaf spring.

The elastic support substrate according to the ninth aspect of the disclosure is such that the elastic support substrate is a sheet configured to cover an entire face of the flexible display.

The elastic support substrate according to the tenth aspect of the disclosure is such that sections including a large film thickness and formed in a strip shape extended in the lateral direction are provided in the sheet at intervals in the longitudinal direction.

The elastic support substrate according to the eleventh aspect of the disclosure is such that sections including a small film thickness and sandwiched by the adjacent sections including a large film thickness elastically deform in the longitudinal direction.

The elastic support substrate according to the twelfth aspect of the disclosure is such that the sections including a large film thickness are less likely to deform in the lateral direction than the sections including a small film thickness.

An flexible display according to the thirteenth aspect of the disclosure is such that the elastic support substrate is stacked on a layered body including a light-emitting element layer as a support body.

A flexible display layered body according to the fourteenth aspect of the disclosure is such that in a flexible display in which a support body is stacked on a layered body including a light-emitting element layer, the elastic support substrate is stacked on a back face of the flexible display.

REFERENCE SIGNS LIST

2 EL display (Flexible display)
4 TFT layer
3 Inorganic barrier film
5 Light-emitting element layer
6 Sealing layer
7 Layered body
8, 11 Adhesive layer
9 Protection material
10 Support material
12 Resin layer
15 Semiconductor film
16 Inorganic insulating film (Gate insulating film)
18, 20 Inorganic insulating film
21 Flattening film
22 Anode electrode
23*b* Bank
23*c* Partition
24 EL layer
25 Cathode electrode 26 Inorganic sealing film (First inorganic sealing film)
27 Organic sealing film
28 Inorganic sealing film (Second inorganic sealing film)
40 Elastic Support Substrate
42 Main substrate
42(3) First main substrate
42(4) Second main substrate
43(1) Arc protrusion area
43(2) Arc recess area (Recess area)
44 Coupling material
45(1, 2) Curved protrusion portion (protrusion portion)
46(1, 2) Curved recess portion (Recess portion)
47(1) First central portion
47(2) Second central portion
50 Sections having large film thickness
52 Sections having small film thickness
80 Windable screen
82 Storage portion
84 Winding core
A MD direction (Longitudinal direction, first direction)
B TD direction (Lateral direction)
F Display face
R Back face
D1 Direction of approaching winding core
D2 Direction of moving away from winding core
L1 Apparent length of main substrate
L2 Apparent length of main substrate

The invention claimed is:

1. An elastic support substrate used for a windable flexible display,
wherein the elastic support substrate elastically deforms in at least a longitudinal direction being a winding direction,
the elastic support substrate is harder to deform in a lateral direction being a direction orthogonal to the longitudinal direction than in the longitudinal direction,
the elastic support substrate further includes
a plurality of non-flexible main substrates configured to be formed in a strip shape and extend in the lateral direction, and
at least one coupling material configured to couple the main substrates,
the plurality of main substrates is arranged in the longitudinal direction,
the at least one coupling material includes a plurality of coupling materials,
the plurality of coupling materials couples the adjacent main substrates,
the at least one coupling material elastically deforms,
the main substrates have an arc shape, and
a radius of curvature of the arc shape corresponds to a radius of curvature of a winding core around which the flexible display is wound.

2. The elastic support substrate according to claim 1, wherein when the flexible display is wound around the winding core, the flexible display is stored on a recess area of the main substrates, the recess area being formed in the arc shape.

3. The elastic support substrate according to claim 1, wherein as the main substrates approach the winding core in the longitudinal direction, the radius of curvature of the arc shape is gradually reduced.

4. The elastic support substrate according to claim 1, wherein the at least one coupling material is at least one of rubber, a coil spring, and a leaf spring.

5. The elastic support substrate according to claim 1, wherein the elastic support substrate is a sheet configured to cover an entire face of the flexible display.

6. The elastic support substrate according to claim 5, wherein sections including a large film thickness and formed in a strip shape extended in the lateral direction are provided in the sheet at intervals in the longitudinal direction.

7. The elastic support substrate according to claim 6, wherein sections including a small film thickness and sandwiched by the adjacent sections including a large film thickness elastically deform in the longitudinal direction.

8. The elastic support substrate according to claim 7, wherein the sections including a large film thickness are less likely to deform in the lateral direction than the sections including a small film thickness.

9. A flexible display,
wherein the elastic support substrate according to claim 1 is stacked on a layered body including a light-emitting element layer as a support body.

10. A flexible display layered body,
wherein in a flexible display in which a support body is stacked on a layered body including a light-emitting element layer, the elastic support substrate according to claim 1 is stacked on a back face of the flexible display.

11. The elastic support substrate according to claim 1,
wherein the main substrates include a plurality of protrusions and a plurality of recesses,
the main substrates include a first main substrate and a second main substrate,
the protrusion of the first main substrate and the recess of the second main substrate adjacent to the first main substrate are opposite to each other,
a direction in which the main substrates are aligned is a first direction, and
the at least one coupling material couples the first main substrate with the second main substrate in parallel to the first direction.

12. The elastic support substrate according to claim 11,
wherein in a first central portion being a central portion between the protrusion of the first main substrate and the recess adjacent to the protrusion in the first main substrate, and
in a second central portion being a central portion between the recess of the second main substrate, the recess being opposite to the protrusion of the first main substrate, and the protrusion of the second main substrate, the protrusion being opposite to the recess of the first main substrate,
the at least one coupling material obliquely couples the first central portion and the second central portion with respect to the first direction.

13. The elastic support substrate according to claim 11, wherein the at least one coupling material is at least one of rubber, a coil spring, and a leaf spring.

14. The elastic support substrate according to claim 11, wherein the elastic support substrate is a sheet configured to cover an entire face of the flexible display.

15. The elastic support substrate according to claim 14, wherein sections including a large film thickness and formed in a strip shape extended in the lateral direction are provided in the sheet at intervals in the longitudinal direction.

16. The elastic support substrate according to claim 15, wherein sections including a small film thickness and sandwiched by the adjacent sections including a large film thickness elastically deform in the longitudinal direction.

17. The elastic support substrate according to claim 16, wherein the sections including a large film thickness are less likely to deform in the lateral direction than the sections including a small film thickness.

18. A flexible display, wherein the elastic support substrate according to claim 11 is stacked on a layered body including a light-emitting element layer as a support body.

19. A flexible display layered body, wherein in a flexible display in which a support body is stacked on a layered body including a light-emitting element layer, the elastic support substrate according to claim 11 is stacked on a back face the flexible display.

* * * * *